(12) United States Patent
Huang et al.

(10) Patent No.: US 7,342,318 B2
(45) Date of Patent: *Mar. 11, 2008

(54) SEMICONDUCTOR PACKAGE FREE OF SUBSTRATE AND FABRICATION METHOD THEREOF

(75) Inventors: Chien Ping Huang, Hsinchu (TW); Yu-Po Wang, Miaoli (TW); Chih-Ming Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 121 days.

This patent is subject to a terminal disclaimer.

(21) Appl. No.: 11/112,145

(22) Filed: Apr. 21, 2005

(65) Prior Publication Data

US 2005/0189659 A1 Sep. 1, 2005

Related U.S. Application Data

(63) Continuation-in-part of application No. 10/420,427, filed on Apr. 22, 2003, now Pat. No. 6,884,652.

(30) Foreign Application Priority Data

Jan. 21, 2003 (TW) ................................ 92101197 A

(51) Int. Cl.
 *H01L 29/40* (2006.01)
(52) U.S. Cl. ...................... 257/778; 257/666; 257/678; 257/690; 257/669; 257/798; 257/784; 257/737
(58) Field of Classification Search ................ 257/666, 257/678, 690, 668, 798, 778, 737, 784

See application file for complete search history.

(56) References Cited

U.S. PATENT DOCUMENTS

| 5,830,800 A | 11/1998 | Lin |
| 5,841,191 A | 11/1998 | Chia et al. |
| 5,859,475 A | 1/1999 | Freyman et al. |
| 6,072,239 A | 6/2000 | Yoneda et al. |
| 6,130,115 A | 10/2000 | Okumura et al. |
| 6,143,981 A | 11/2000 | Glenn |
| 6,229,200 B1 | 5/2001 | Mclellan et al. |
| 6,372,540 B1 | 4/2002 | Huemoeller |
| 6,514,847 B1 | 2/2003 | Ohsawa et al. |
| 6,578,754 B1 | 6/2003 | Tung |

*Primary Examiner*—Junghwa Im
(74) *Attorney, Agent, or Firm*—Peter F. Corless; Steven M. Jensen; Edwards Angell Palmer & Dodge LLP

(57) ABSTRACT

A semiconductor package and a fabrication method thereof are provided in which a dielectric material layer formed with a plurality of openings is used and a solder material is applied into each of the openings. A first copper layer and a second copper layer are in turn deposited over the dielectric material layer and solder materials, and the first and second copper layers are patterned to form a plurality of conductive traces each of which has a terminal coated with a metal layer. A chip is mounted on the conductive traces and electrically connected to the terminals by bonding wires, with the dielectric material layer and solder materials being exposed to the outside. This package structure can flexibly arrange the conductive traces and effectively shorten the bonding wires, thereby improve trace routability and quality of electrical connection for the semiconductor package.

14 Claims, 11 Drawing Sheets

SEMICONDUCTOR PACKAGE FREE OF SUBSTRATE AND FABRICATION METHOD THEREOF

CROSS-REFERENCE TO RELATED APPLICATION

This application is a continuation-in-part of application Ser. No. 10/420,427 filed on Apr. 22, 2003 now U.S. Pat. No. 6,884,652, the disclosure of which is expressly incorporated herein by reference.

FIELD OF INVENTION

The present invention relates to semiconductor packages and fabrication methods thereof, and more particularly, to a semiconductor package with improved trace routability without having to use a substrate, and a method for fabricating the semiconductor package.

BACKGROUND OF THE INVENTION

A conventional lead-frame-based semiconductor package, such as QFN (quad flat non-leaded) package, incorporates a semiconductor chip on a lead frame serving as a chip carrier, and exposes leads of the lead frame to outside of an encapsulant that encapsulates the chip, allowing the exposed leads as input/output (I/O) connections to be electrically connected to an external device such as printed circuit board (PCB).

This QFN semiconductor package is disclosed in U.S. Pat. Nos. 6,130,115, 6,143,981 and 6,229,200; as shown in FIG. 6, at least one chip 20 is mounted via an adhesive (not shown) on a die pad 210 of a lead frame 21 and electrically connected to a plurality of leads 211 surrounding the die pad 210 by bonding wires 22. An encapsulant 23 formed of a resin material (such as epoxy resin) encapsulates the chip 20, bonding wires 22, and lead frame 21, with at least one surface 212 of each lead 211 being exposed to outside of the encapsulant 23.

As shown in FIG. 7A, since the leads 211 of the lead frame 21 is substantially proportional in number to bond pads 201 formed on an active surface 200 of the chip 20, each bond pad 201 is electrically connected via a bonding wire 22 to a corresponding lead 211. The leads 211 are spaced apart from the die pad 210 by a predetermined distance, such that the bonding wires 22 need to be greater in length than the distance between the leads 211 and die pad 210 so as to effect successful electrical connection between the chip 20 and leads 211. As shown in FIG. 7B, in the case of using a highly integrated chip 20' having more bond pads 201 or higher density of bond pads 201, more leads 211 are accordingly required for electrical connection with the bond pads 201, thus making the distance between the leads 211 and die pad 210 and the length of bonding wires 22' increased. Long bonding wires 22', however, make a wire bonding process harder to implement and are easily subject to wire sweep or shift due to resin flow impact in a molding process for forming the encapsulant 23. The swept or shifted bonding wires may accidentally come into contact with each other and cause short circuits, which would undesirably degrade quality of electrical connection. Further, if the leads and die pad are spaced apart from each other too far, the wire bonding process may even be impossibly performed and thus fails to use bonding wires to electrically connect the chip to the leads of the lead frame.

In order to reduce the length of bonding wires or the distance between the leads and die pad, as shown in FIG. 8, another semiconductor package is produced in which each lead 211 is half-etched to form a protruding portion 213 extending toward the die pad 210 so as to reduce the distance between the leads 211 and die pad 210, such that bonding wires 22 with proper length can be used to electrical connect the highly integrated chip 20' to the protruding portions 213 of the leads 211.

However, fabrication of the protruding portions 213 would undesirably increase costs and process complexity for making the lead frame 21'. And, during the wire bonding process, the protruding portions 213 of the leads 211 may easily dislocate in position, making it hard to precisely bond the bonding wires 22 thereto.

U.S. Pat. Nos. 5,830,800 and 6,072,239 provide a semiconductor package free of using a substrate, whose fabrication processes are primarily illustrated with reference to FIGS. 9A to 9D. Referring to FIG. 9A, the first step is to prepare a copper-made carrier 30 and mount a mask 31 over a surface of the carrier 30, wherein the mask 31 is formed with a plurality of openings 310 via which predetermined portions of the carrier 30 are exposed. Referring to FIG. 9B, the next step is to electrically plate a contact (or terminal) 32 in each of the openings 310 and then to remove the mask 31 from the carrier 30 to expose the carrier 30 and contacts 32. Referring to FIG. 9C, a die bonding process and a wire bonding process are in turn performed by which a chip 33 is mounted on the carrier 30 and electrically connected to the contacts 32 by a plurality of bonding wires 34. Then, a molding process is carried out to form an encapsulant 35 on the carrier 30 for encapsulating the chip 33 and bonding wires 34. Referring to FIG. 9D, the carrier 30 is etched away to expose surfaces 320, originally in contact with the carrier 30, of the contacts 32, and the exposed contacts 32 serve as input/output (I/O) connections of the semiconductor package to be electrically connected to an external device (not shown).

The above semiconductor package yields a significant benefit as not having to use a substrate or lead frame for accommodating chips; as a result, the encapsulant 35 is not attached to the above-mentioned lead frame 21 and there is no concern of delamination between the encapsulant 35 and lead frame 21. However, similarly to the previously discussed packaging technology, in the case of using a highly integrated chip 33 with more bond pads or higher density of bond pads, more contacts 32 are accordingly required and undesirably increase the distance between the contacts 32 and chip 33, thereby causing the similar problems as shown in FIG. 7B that long bonding wires are subject to wire sweep or shift and degrade quality of electrical connection.

Therefore, the problem to be solved herein is to provide a semiconductor package which can flexibly arrange conductive traces and effectively shorten bonding wires so as to improve trace routability and quality of electrical connection for the semiconductor package.

SUMMARY OF THE INVENTION

An objective of the present invention is to provide a semiconductor package and a fabrication method thereof, which can flexibly arrange conductive traces and effectively shorten bonding wires, thereby improving trace routability and quality of electrical connection for the semiconductor package.

Another objective of the invention is to provide a semiconductor package and a fabrication method thereof without having to use a substrate to thereby reduce fabrication costs of the semiconductor package.

In accordance with the foregoing and other objectives, the present invention proposes a semiconductor package, comprising: a dielectric material layer formed with a plurality of openings penetrating through the dielectric material layer; a solder material applied in each of the openings; a first copper layer formed over the dielectric material layer and solder materials in the openings; a second copper layer formed over the first copper layer, allowing the first and second copper layers to be patterned to form a plurality of conductive traces, each of the conductive traces having a terminal, wherein the first copper layer is smaller in thickness than the second copper layer; a metal layer applied on each of the terminals; at least one chip mounted on a predetermined portion of the conductive traces; a plurality of conductive elements, such as bonding wires or solder bumps, for electrically connecting the chip to the terminals; and an encapsulant for encapsulating the chip, conductive elements, and conductive traces, with the dielectric material layer and solder materials being exposed to outside of the encapsulant.

A method for fabricating the above semiconductor package includes the steps of: preparing a metal carrier; applying a dielectric material layer over a surface of the metal carrier, and forming a plurality of openings penetrating through the dielectric material layer; electrically plating a solder material in each of the openings; electrolessly plating or sputtering a first copper layer over the dielectric material layer and solder materials in the openings; electrically plating a second copper layer over the first copper layer, and patterning the first and second copper layers to form a plurality of conductive traces, each of the conductive traces having a terminal, wherein the first copper layer is smaller in thickness than the second copper layer; electrically plating a metal layer on each of the terminals; mounting at least one chip on a predetermined portion of the conductive traces; forming a plurality of conductive elements, such as bonding wires or solder bumps, to electrically connect the chip to the terminals; forming an encapsulant to encapsulate the chip, conductive elements, and conductive traces; and etching away the metal carrier to expose the dielectric material layer and solder materials.

In another embodiment, the semiconductor package in the present invention comprises: a first dielectric material layer formed with a plurality of openings penetrating the same; a conductive material applied in the openings of the first dielectric material layer; a first conductive layer formed on the first dielectric material layer and the conductive material, wherein the first conductive layer comprises a plurality of conductive traces; a second dielectric material layer applied over the first conductive layer, wherein a plurality of conductive vias are formed through the second dielectric material layer; a second conductive layer formed on the second dielectric material layer, and comprising a plurality of conductive traces, wherein each of the conductive traces of the second conductive layer has a terminal, and the conductive traces of the second conductive layer are electrically connected to the conductive traces of the first conductive layer by the conductive vias; at least one chip mounted on the second dielectric material layer and electrically connected to the terminals of the conductive traces of the second conductive layer; and an encapsulant for encapsulating the chip and the second conductive layer, with the first dielectric material layer and the conductive material being partly exposed from the encapsulant.

The method for fabricating the above semiconductor package comprises the steps of: preparing a metal carrier; applying a first dielectric material layer over a surface of the metal carrier, and forming a plurality of openings through the first dielectric material layer; applying a conductive material in the openings of the first dielectric material layer; forming a first conductive layer on the first dielectric material layer and the conductive material, wherein the first conductive layer comprises a plurality of conductive traces; applying a second dielectric material layer over the first conductive layer, wherein a plurality of conductive vias are formed through the second dielectric material layer; forming a second conductive layer on the second dielectric material layer, the second conductive layer comprising a plurality of conductive traces, wherein each of the conductive traces of the second conductive layer has a terminal, and the conductive traces of the second conductive layer are electrically connected to the conductive traces of the first conductive layer by the conductive vias; mounting at least one chip on the second dielectric material layer, and electrically connecting the chip to the terminals of the conductive traces of the second conductive layer; forming an encapsulant for encapsulating the chip and the second conductive layer; and removing the metal carrier to partly expose the first dielectric material layer and the conductive material.

The first conductive layer comprises a first copper layer formed on the first dielectric material layer and the conductive material, and a second copper layer formed on the first copper layer and comprising the plurality of conductive traces. The second conductive layer comprises a first copper layer formed on the second dielectric material layer, and a second copper layer formed on the first copper layer and comprising the plurality of conductive traces. The first copper layer of each of the first and second conductive layers is smaller in thickness than the second copper layer thereof.

The semiconductor package in the present invention yields a significant benefit as not having to use a substrate or lead frame as a chip carrier; instead, a chip is mounted on conductive traces which can be flexibly arranged according to bond pad distribution of the chip. The flexible arrangement of conductive traces can effectively shorten the bonding wires used for electrically connecting the chip to terminals (bond fingers) of the conductive traces, thereby reducing an electrical connection path between the chip and conductive traces. As a result, the prior-art problems such as short circuits caused by long bonding wires and difficulty in performing the wire bonding process can be eliminated. Moreover, fabrication costs for the semiconductor package are also desirably reduced without having to use a substrate or lead frame.

BRIEF DESCRIPTION OF THE DRAWING

The present invention can be more fully understood by reading the following detailed description of the preferred embodiments, with reference made to the accompanying drawings, wherein.

DETAILED DESCRIPTION OF THE INVENTION

Preferred embodiments of a semiconductor package and a fabrication method thereof proposed by the present invention are described in detail as follows with reference to FIGS. 1 to 5.

First Preferred Embodiment

Figure 1:
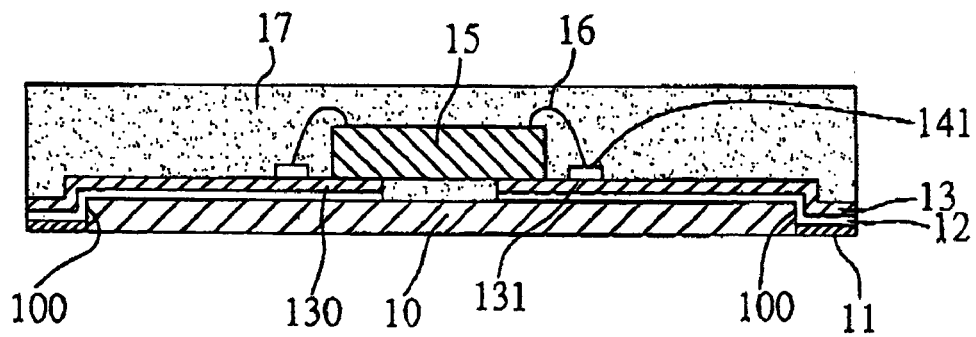
FIG. 1 is a cross-sectional view of a semiconductor package according to a first preferred embodiment of the invention.
Figure 2:
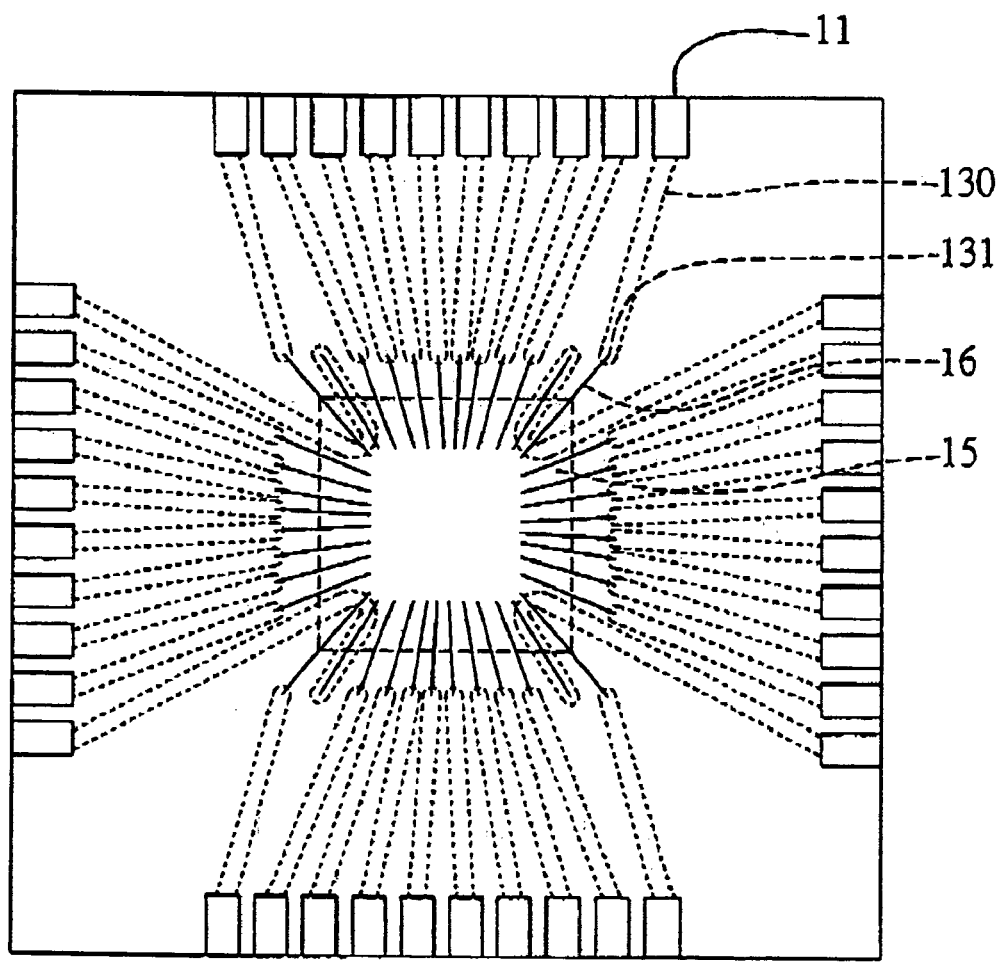
FIG. 2 is a bottom view of the semiconductor package shown in FIG. 1.

The present invention provides a semiconductor package free of using a substrate; as shown in FIGS. 1 and 2, this semiconductor package includes a dielectric material layer 10 formed with a plurality of openings 100 penetrating through the dielectric material layer 10; a solder material 11 applied in each of the openings 100; a first copper layer 12 formed over the dielectric material layer 10 and solder materials 11 in the openings 100; a second copper layer 13 formed over the first copper layer 12, allowing the first and second copper layers 12, 13 to be patterned to form a plurality of conductive traces 130 each having a terminal 131, wherein the first copper layer 12 is smaller in thickness than the second copper layer 13; a metal layer 141 applied on each of the terminals 131; at least one chip 15 mounted on a predetermined portion of the conductive traces 130; a plurality of bonding wires 16 for electrically connecting the chip 15 to the metal layers 141 of the terminals 131; and an encapsulant 17 for encapsulating the chip 15, bonding wires 16, and conductive traces 130, with the dielectric material layer 10 and solder materials 11 being exposed to outside of the encapsulant 17.

The above semiconductor package can be fabricated by procedural steps shown in FIGS. 3A to 3G.

Figure 3A:
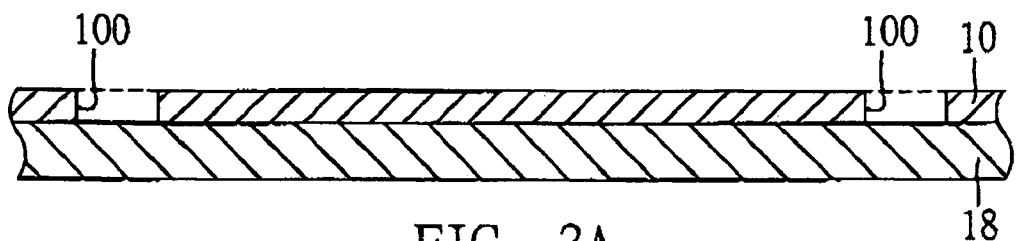
FIGS. 3A-3G are schematic diagrams showing procedural steps for fabricating the semiconductor package shown in FIG. 1.

Referring to FIG. 3A, the first step is to prepare a metal carrier 18 such as copper plate and apply a dielectric material layer 10 over a surface of the copper plate 18. The dielectric material layer 10 can be made of a non-conductive material such as epoxy resin, polyimide, or PTFE (polytetrafluoroethylene). Then, a plurality of openings 100 are formed and penetrate through the dielectric material layer 10, allowing predetermined portions of the copper plate 18 to be exposed via the openings 100 that are subsequently used to form input/output (I/O) connections of the semiconductor package.

Figure 3B:
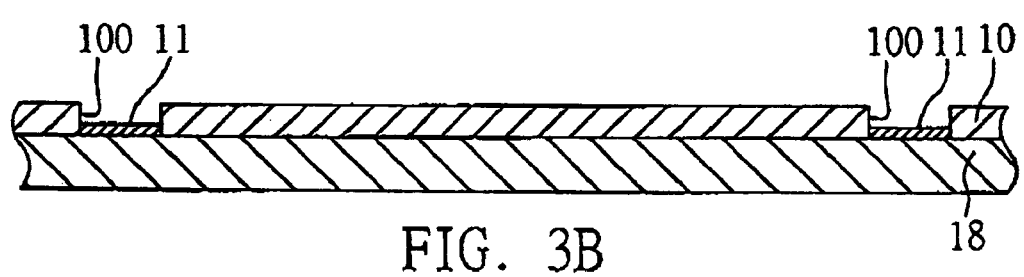

Referring to FIG. 3B, the next step is to deposit a solder material 11 such as tin/lead (Sn/Pb) alloy by an electrical plating technique in each of the openings 100 of the dielectric material layer 10 and over each exposed portion of the copper plate 18, wherein a thickness of the solder material 11 deposited in each opening 100 is preferably smaller than a depth of the opening 100. Surfaces of the solder materials 11, in contact with the copper plate 18, are later to be exposed and serve as the I/O connections of the semiconductor package. The electrical plating technique is conventional and not to be further described.

Figure 3C:
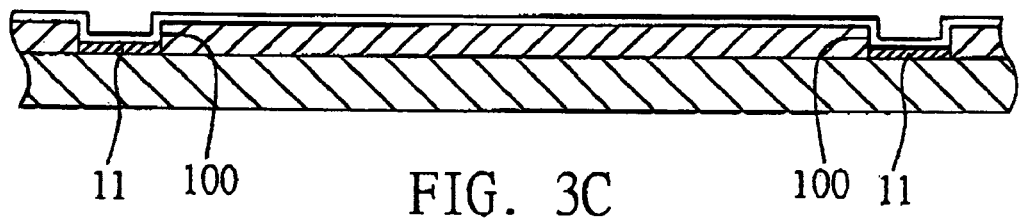

Then, referring to FIG. 3C, a first copper layer 12 is formed over the dielectric material layer 10 and solder materials 111 by an electroless plating or sputtering technique, allowing the first copper layer 12 to entirely cover the dielectric material layer 10 and solder materials 111 deposited in the openings 100. The first copper layer 12 is around 1-3 µm thick. The electroless plating or sputtering technique is conventional and not to be further described.

Figure 3D:
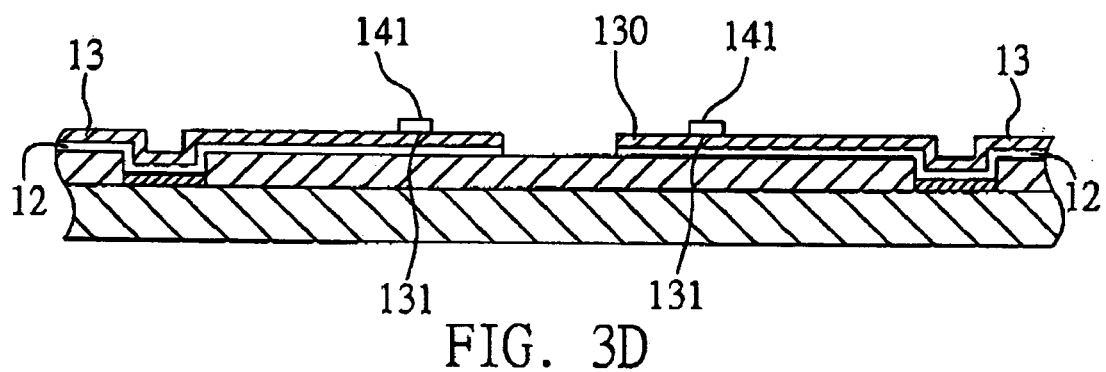
Figure 3D:
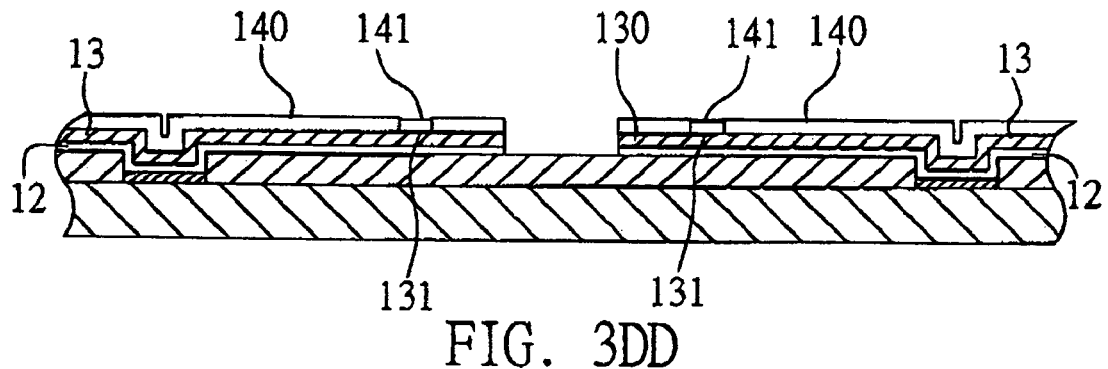

Referring to FIG. 3D, a second copper layer 13 is formed by the electrical plating technique over the first copper layer 12 and has a thickness of around 15-20 µm larger than that of the first copper layer 12. Then, the first and second copper layers 12, 13 are subject to exposing, developing, and etching processes to be patterned to form a plurality of conductive traces 130 each having a terminal 131; the terminals 131 are later to be used as bond fingers and electrically connected with a chip (not shown).

Optionally, as shown in FIG. 3DD, an insulating layer 140, such as solder mask or polyimide, can be applied over the conductive traces 130 for protection purposes. The insulating layer 140 covers the conductive traces 130 with the terminals 131 being exposed to outside of the insulating layer 140, and the exposed terminals 131 subsequently serve as bond fingers.

Thereafter, a metal layer 141 is formed by the electrical plating technique on each terminal (or bond finger) 131 of the conductive traces 130. The metal layer 141 can be a silver (Ag) layer or a nickel/gold (Ni/Au) layer, preferably having good bondability with a conductive element (such as bonding wire, not shown) for being electrically connected to a chip (not shown).

Figure 3E:
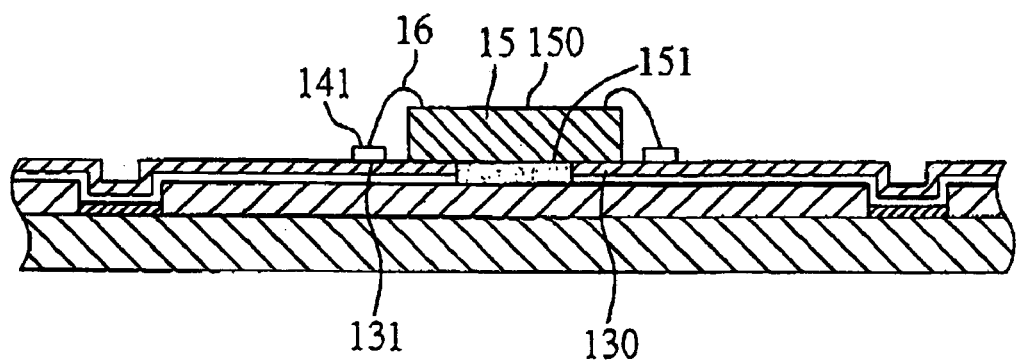

Referring to FIG. 3E, a chip 15 is prepared, having an active surface 150 formed with a plurality of electronic elements and circuits (not shown) and a non-active surface 151 opposed to the active surface 150. A die bonding process is performed to attach the non-active surface 151 of the chip 15 via an adhesive (not shown) to a predetermined portion of the conductive traces 130.

Then, a wire bonding process is performed to form and bond a plurality of bonding wires 16 to the active surface 150 of the chip 15 and to the metal layers 141 on the bond fingers 131, whereby the chip 15 can be electrically connected to the bond fingers 131 via the bonding wires 16.

Figure 3F:
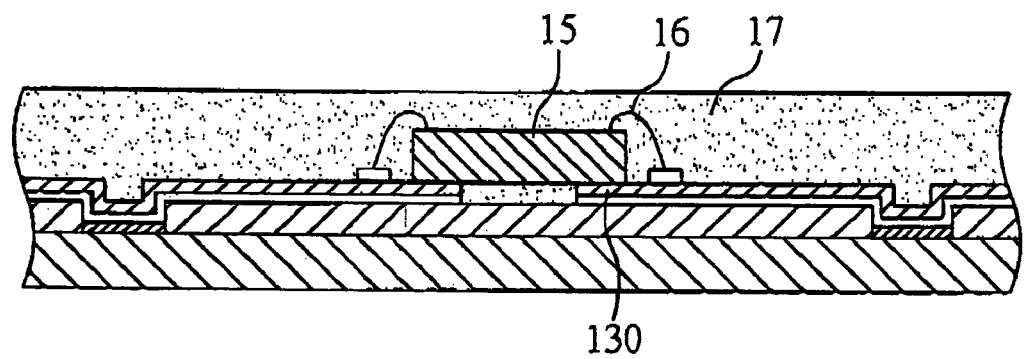

Referring to FIG. 3F, a molding process is carried out by which the die-bonded and wire-bonded semi-fabricated structure is placed in a conventional encapsulation mold (not shown), and a resin material such as epoxy resin is injected and filled into a mold cavity (not shown) of the encapsulation mold to form an encapsulant 17 that encapsulates and protects the chip 15, bonding wires 16, and conductive traces 130 against damage from external moisture or contaminant. After the resin material is cured, the encapsulation mold is removed and the encapsulant 17 is completely fabricated.

Figure 3G:
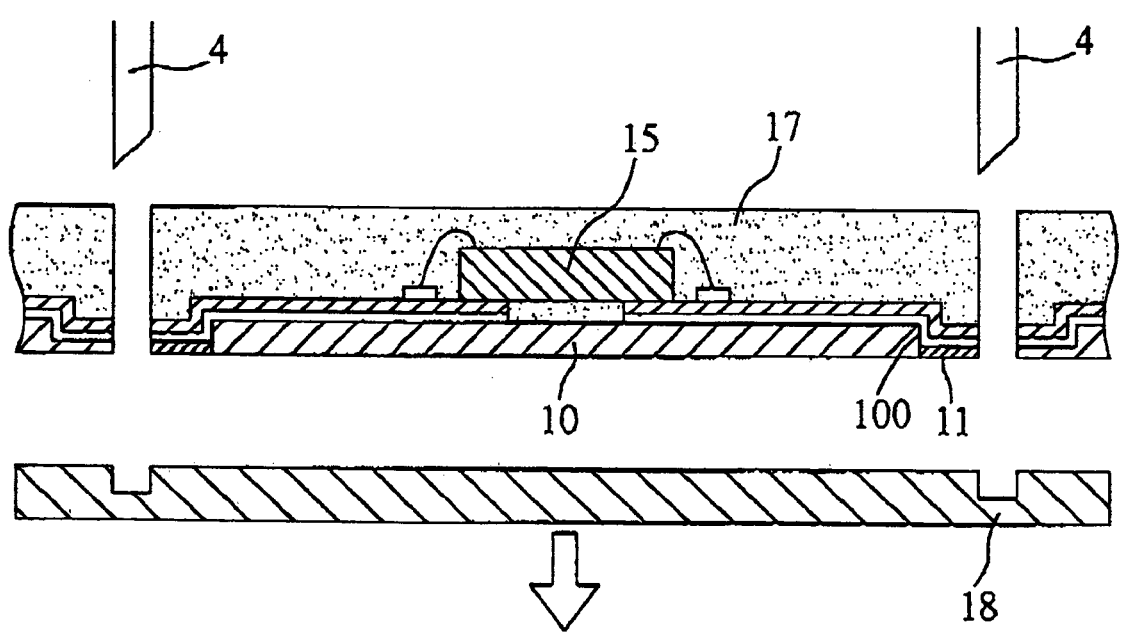

Finally, referring to FIG. 3G, after forming the encapsulant 17, a singulation process is performed and uses a cutting machine 4 to cut through the encapsulant 17. Then the copper plate 18 is removed by an etching process from the dielectric material layer 10, and thus surfaces, originally in contact with the copper plate 18, of the dielectric material layer 10 and solder materials 11 in the openings 100 are exposed outside. This thereby completes fabrication of the semiconductor package shown in FIGS. 1 and 2, and the exposed solder materials 11 act as I/O connections to be electrically connected to an external device such as printed circuit board (PCB, not shown).

The above semiconductor package yields a significant benefit as not having to use a substrate or lead frame as a chip carrier; instead, a chip is mounted on conductive traces which can be flexibly arranged according to bond pad distribution of the chip. The flexible arrangement of conductive traces can effectively shorten the bonding wires used for electrically connecting the chip to terminals (bond fingers) of the conductive traces, thereby reducing an electrical connection path between the chip and conductive traces. As a result, the prior-art problems such as short circuits caused by long bonding wires and difficulty in performing the wire bonding process can be eliminated. Moreover, fabrication costs for the semiconductor package are also desirably reduced without having to use a substrate or lead frame.

Second Preferred Embodiment

Figure 4:
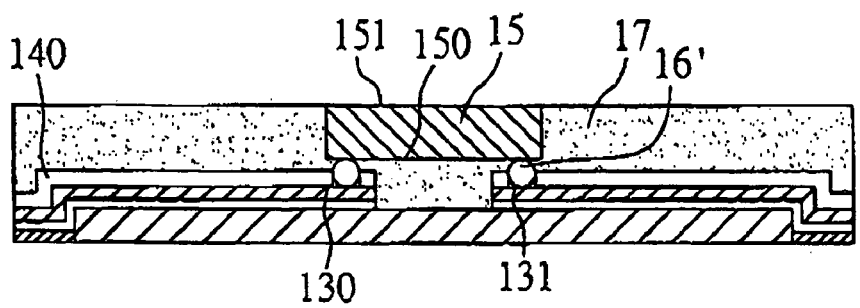
FIG. 4 is a cross-sectional view of a semiconductor package according to a second preferred embodiment of the invention.

FIG. 4 illustrates a semiconductor package according to a second preferred embodiment of the invention. As shown in the drawing, this semiconductor package differs from that of the above first embodiment in that the chip 15 is mounted in a flip-chip manner on the conductive traces 130. In particular, during a die bonding process, the active surface 150 of the chip 15 is directed toward the conductive traces 130 and electrically connected via solder bumps 16' to the terminals 131 of the conductive traces 130 where the terminals 131 serve as bond pads used to be bonded with the solder bumps 16'. Alternatively, an insulating layer 140 can be applied over the conductive traces 130 with the terminals 131 being exposed and connected to the solder bumps 16'.

Compared to the use of bonding wires for electrically connecting the chip and conductive traces, the flip-chip technology can further reduce an electrical connection distance from the chip 15 to conductive traces 130 via solder bumps 16', thereby assuring quality of electrical connection between the chip 15 and conductive traces 130.

Moreover, the non-active surface 151 of the chip 15 is optionally exposed to outside of the encapsulant 17 encapsulating the chip 15. This allows heat produced from operation of the chip 15 to be effectively dissipated via the exposed non-active surface 151, thereby improving heat dissipating efficiency of the semiconductor package.

Third Preferred Embodiment

Figure 5:
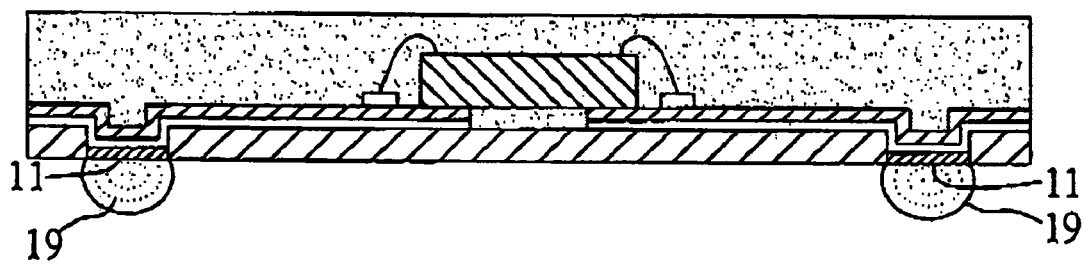
FIG. 5 is a cross-sectional view of a semiconductor package according to a third preferred embodiment of the invention.
Figure 6:
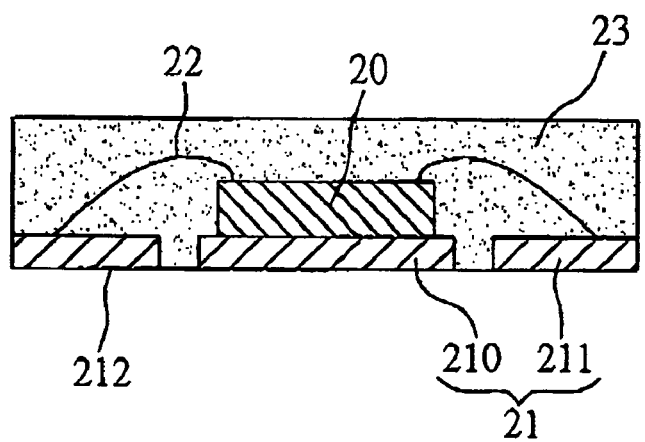
FIG. 6 (PRIOR ART) is a cross-sectional view of a conventional semiconductor package.
Figure 7A:
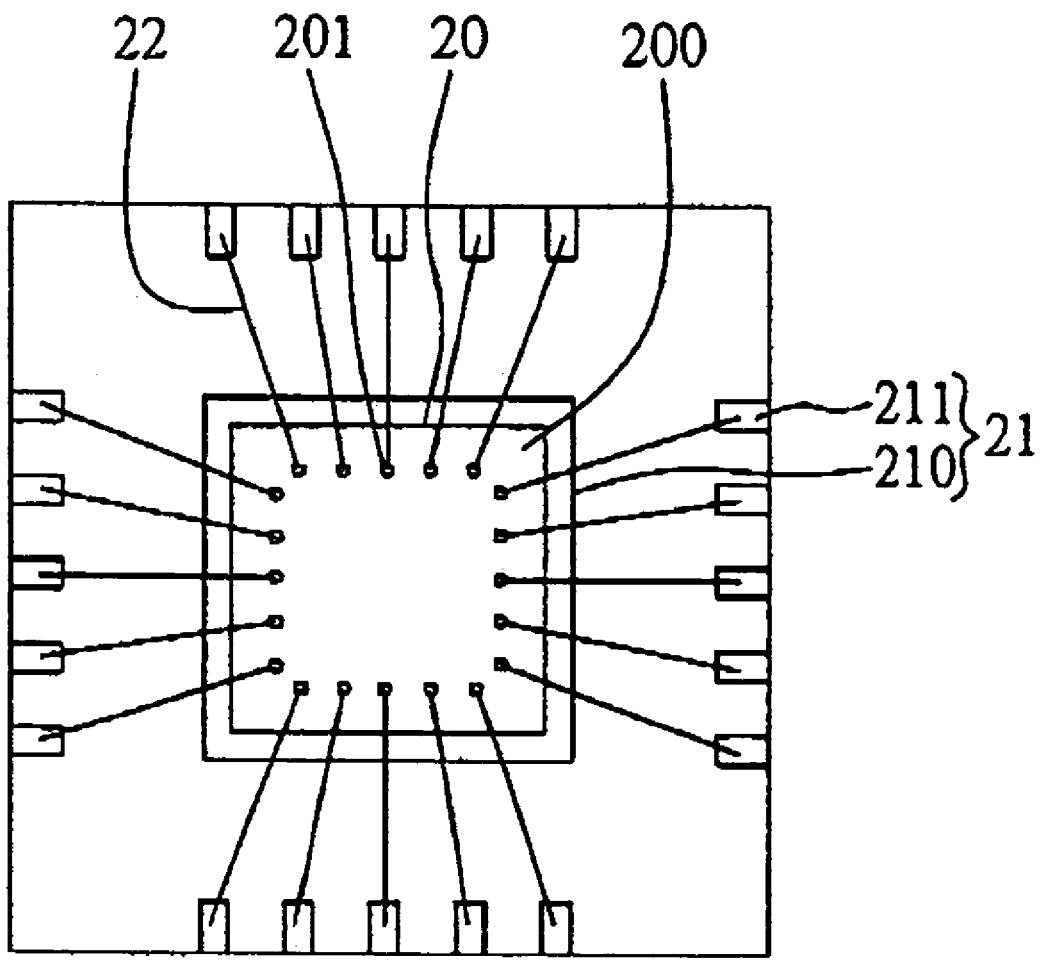
FIGS. 7A and 7B (PRIOR ART) are top views of the semiconductor package shown in FIG. 6.
Figure 7B:
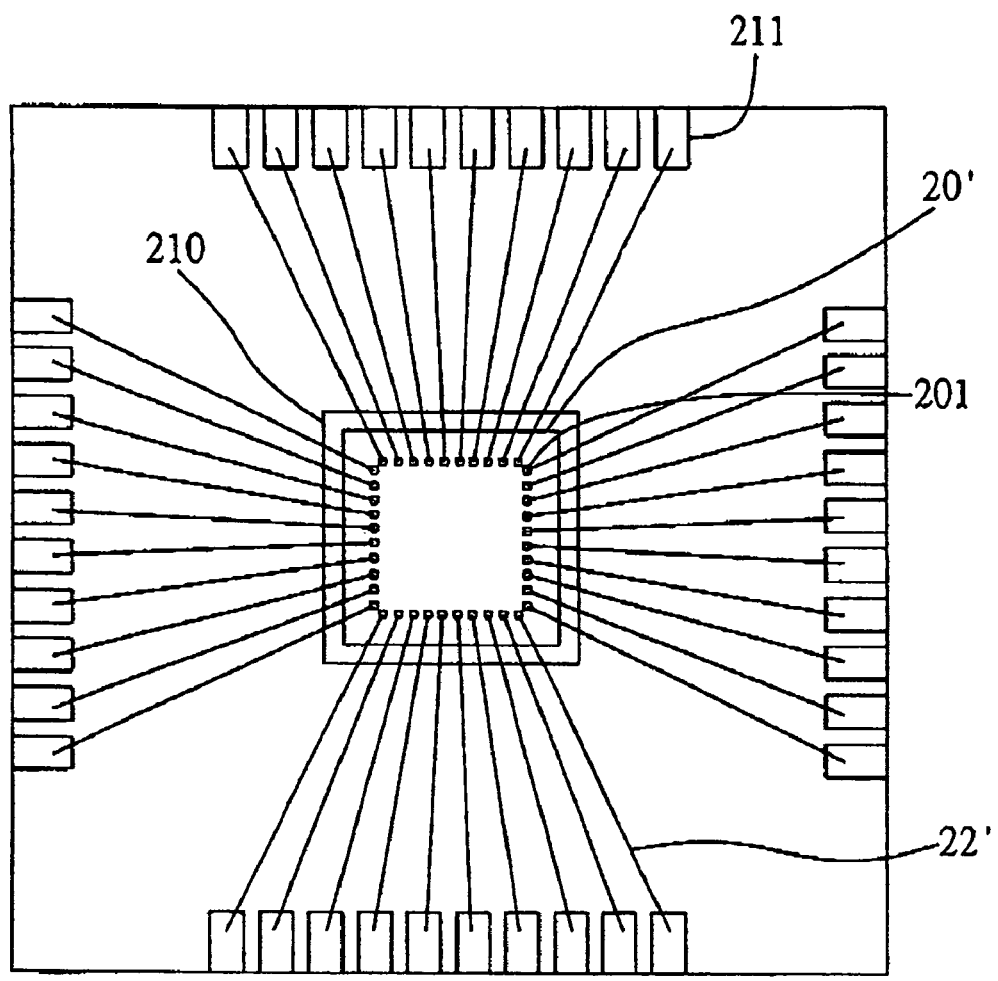
Figure 8:
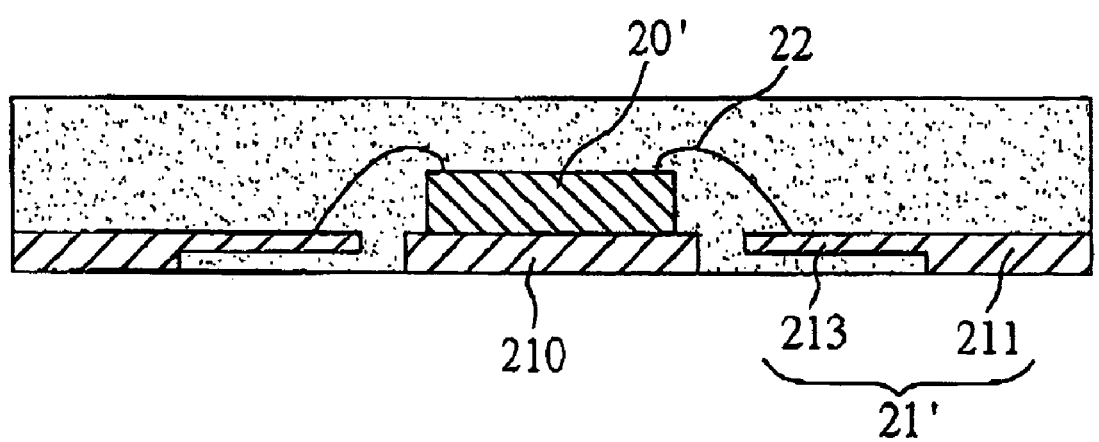
FIG. 8 (PRIOR ART) is a cross-sectional view of another conventional semiconductor package.
Figure 9A:
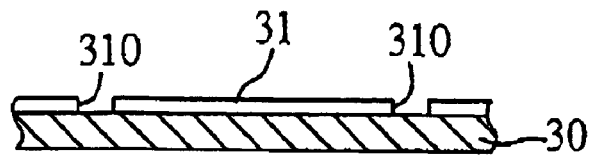
FIGS. 9A-9D (PRIOR ART) are schematic diagrams showing procedural steps for fabricating a further conventional semiconductor package.
Figure 9B:
Figure 9C:
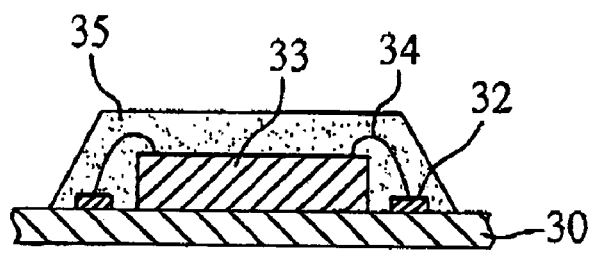
Figure 9D:
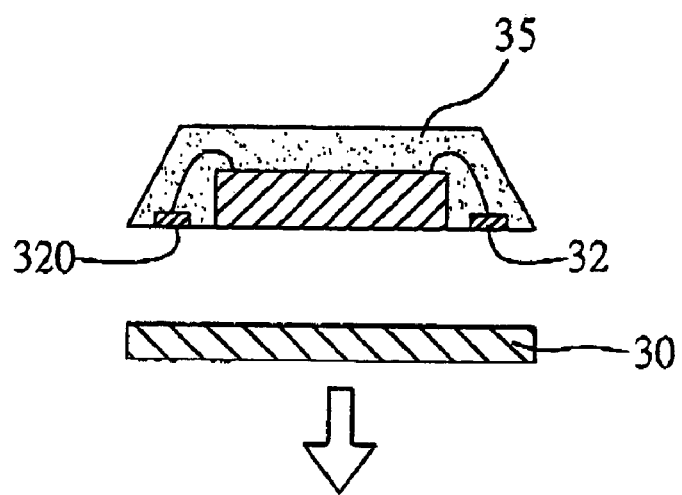

FIG. 5 illustrates a semiconductor package according to a third preferred embodiment of the invention. This semiconductor package differs from that of the above first embodiment in that a plurality of solder balls 19 are implanted on the exposed solder materials 11 to form a ball grid array. These solder balls 19 serve as I/O connections of the semiconductor package to be electrically connected with an external device (not shown).

Fourth Preferred Embodiment

Figure 10:
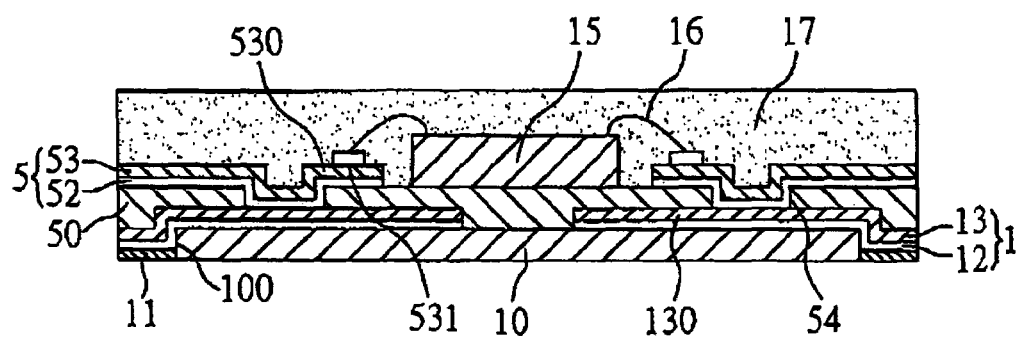
FIG. 10 is a cross-section view of a semiconductor package according to a fourth preferred embodiment of the invention.

FIG. 10 shows a semiconductor package according to a fourth preferred embodiment of the invention. The fourth embodiment is similar to the above first embodiment, with differences in that besides the dielectric material layer 10 (hereinafter referred to as "first dielectric material layer 10") having openings 100 and the first and second copper layers 12, 13 shown in FIG. 1, a second dielectric material layer 50 and another set of a first copper layer 52 and a second copper layer 53 are formed, and the chip 15 is mounted on the second dielectric material layer 50 in the semiconductor package shown in FIG. 10.

As shown in FIG. 10, the semiconductor package according to the fourth embodiment of the invention comprises a first dielectric material layer 10 formed with a plurality of openings 100 penetrating the same; a conductive material 11 applied in the openings 100 of the first dielectric material layer 10; a first conductive layer 1 formed on the first dielectric material layer 10 and the conductive material 11, wherein the first conductive layer 1 comprises a plurality of conductive traces 130; a second dielectric material layer 50 applied over the first conductive layer 1, wherein a plurality of conductive vias 54 are formed through the second dielectric material layer 50; a second conductive layer 5 formed on the second dielectric material layer 50, and comprising a plurality of conductive traces 530, wherein each of the conductive traces 530 of the second conductive layer 5 has a terminal 531, and the conductive traces 530 of the second conductive layer 5 are electrically connected to the conductive traces 130 of the first conductive layer 1 by the conductive vias 54; at least one chip 15 mounted on the second dielectric material layer 50 and electrically connected to the terminals 531 of the conductive traces 530 of the second conductive layer 5; and an encapsulant 17 for encapsulating the chip 15 and the second conductive layer 5, with the first dielectric material layer 10 and the conductive material 11 being partly exposed from the encapsulant 17.

Figure 11A:
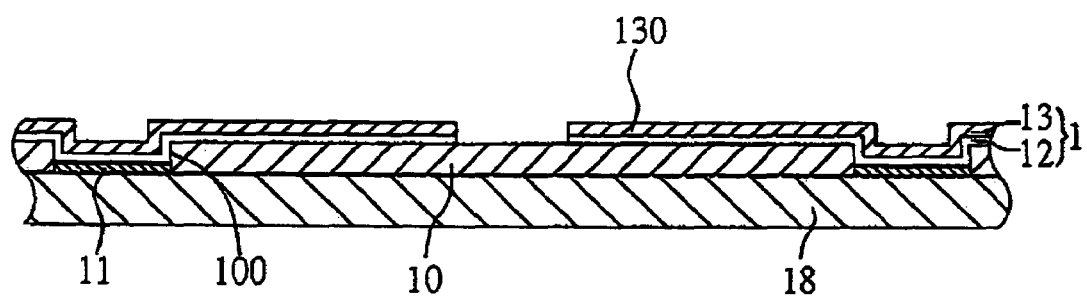
FIGS. 11A-11F are schematic diagrams showing procedural steps for fabricating the semiconductor package shown in FIG. 10.

In the fabrication method of the semiconductor package shown in FIG. 10, after the processes shown in FIGS. 3A and 3B that a metal carrier 18 is prepared and applied with a first dielectric material layer 10 thereon having a plurality of openings 100, and a conductive material such as a solder material 11 is deposited in the openings 100 of the first dielectric material layer 10, referring to FIG. 11A, a first conductive layer 1 is formed on the first dielectric material layer 10 and the solder material 11, wherein the first conductive layer 1 comprises a first copper layer 12 and a second copper layer 13. Preferably, the first copper layer 12 is firstly formed over the first dielectric material layer 10 and the solder material 11 by for example the conventional electroless plating or sputtering technique. The first copper layer 12 is approximately 1 to 3 μm thick. Then, the second copper layer 13 is formed over the first copper layer 12 by for example the conventional electroplating technique. The second copper layer 13 has a thickness of approximately 15 to 20 μm, which is larger than the thickness of the first copper layer 12. Subsequently, the first and second copper layers 12, 13 are patterned by for example exposing, developing and etching processes to form a plurality of conductive traces 130.

Figure 11B:
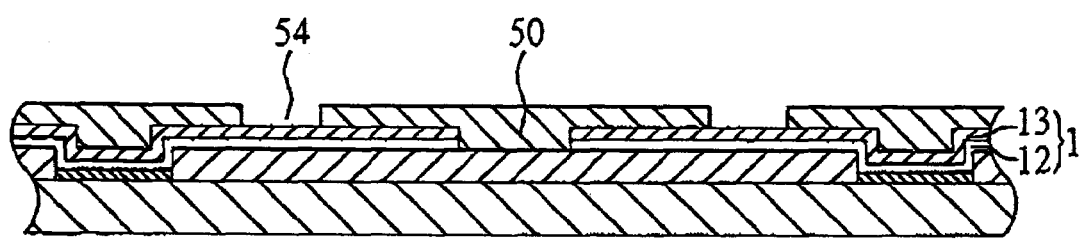

Referring to FIG. 11B, a second dielectric material layer 50 is applied over the second copper layer 13 of the first conductive layer 1. The second dielectric material layer 50 can be made of the same material as the first dielectric material layer 10. A plurality of vias 54 are formed through the second dielectric material layer 50, such that a predetermined portion of the first conductive layer 1 is exposed by the vias 54.

Figure 11C:
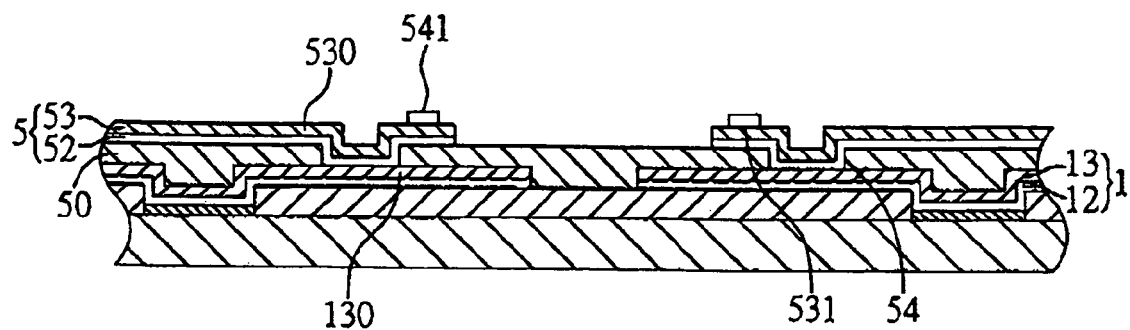
Figure 11C:
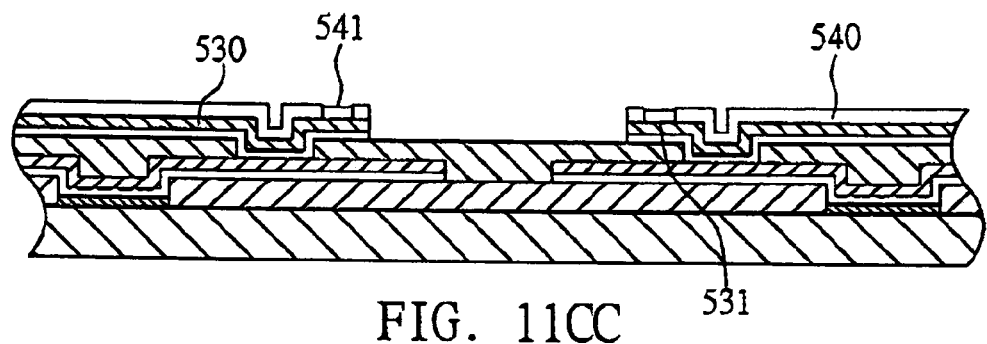

Referring to FIG. 11C, a second conductive layer 5 is formed on the second dielectric material layer 50 and on the exposed portion of the first conductive layer 1 in the vias 54, wherein the second conductive layer 5 comprises a first copper layer 52 and a second copper layer 53. Preferably, the first copper layer 52 is firstly formed over the second dielectric material layer 50 by for example the conventional electroless plating or sputtering technique. The first copper layer 52 is approximately 1 to 3 μm thick. Then, the second copper layer 53 is formed over the first copper layer 52 by for example the conventional electroplating technique. The second copper layer 53 has a thickness of approximately 15 to 20 μm, which is larger than the thickness of the first copper layer 52. Subsequently, the first and second copper layers 42, 43 are patterned by for example exposing, developing and etching processes to form a plurality of conductive traces 530 each having a terminal 531. The conductive traces 530 of the second conductive layer 5 can be electrically connected to the conductive traces 130 of the first conductive layer 1 by the vias 54 in the second dielectric material layer 50, such that the vias 54 are referred to as conductive vias.

Optionally, as shown in FIG. 11CC, an insulating layer 540 can be applied over the conductive traces 530 for the protection purpose. The insulating layer 540 can be made of solder mask or polyimide. The insulating layer 540 covers the conductive traces 530, with the terminals 531 of the conductive traces 530 being exposed from the insulating layer 540.

Then, a metal layer 541 can be formed on the terminals 531 of the conductive traces 530 by for example the conventional electroplating technique. The metal layer 541 can be made of silver or a nickel/gold alloy, which preferably has good bondability with subsequent conductive elements such as bonding wires or solder bumps to be bonded thereto.

Figure 11D:
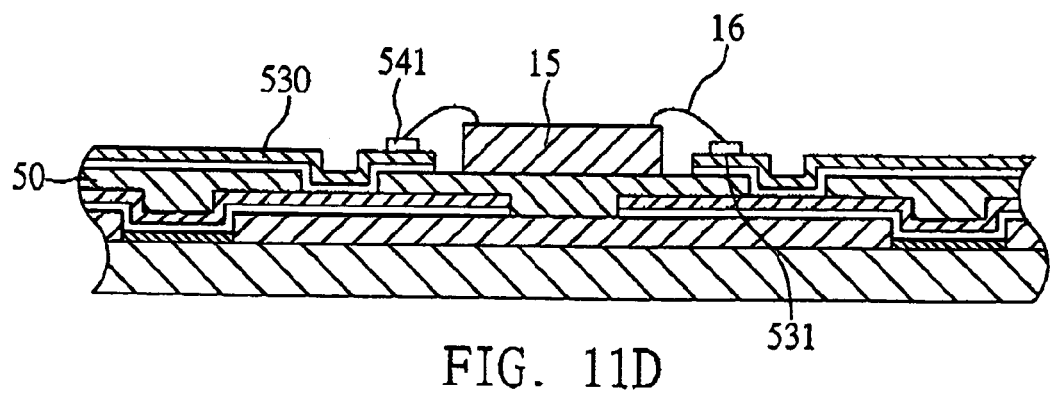

Referring to FIG. 11D, at least one chip 15 is mounted on the second dielectric material layer 50, and is electrically connected to the terminals 531 of the conductive traces 530 by a plurality of bonding wires 16. The bonding wires 16 are bonded to the chip 16 and to the metal layer 541 on the terminals 531 of the conductive traces 530. Alternatively, the chip can be electrically connected to the terminals of the conductive traces by a plurality of solder bumps, similarly to the structure of the second embodiment shown in FIG. 4.

Figure 11E:
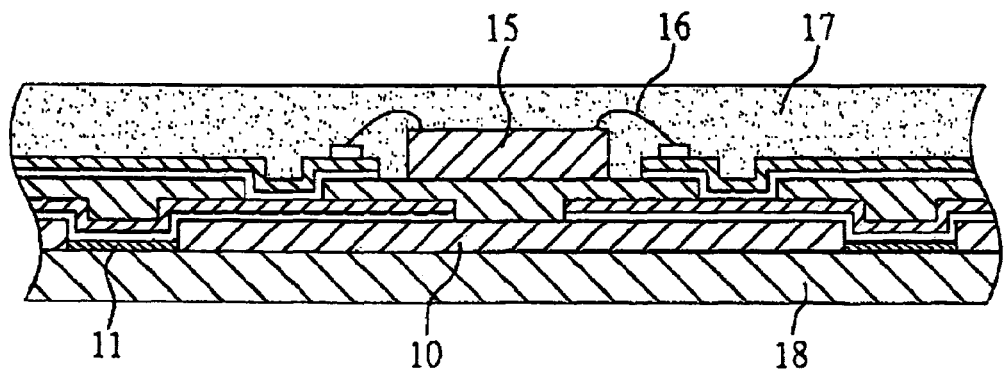

Referring to FIG. 11E, a molding process is performed to form an encapsulant 17 for encapsulating the chip 15, the bonding wires 16 and the second conductive layer 5.

Figure 11F:
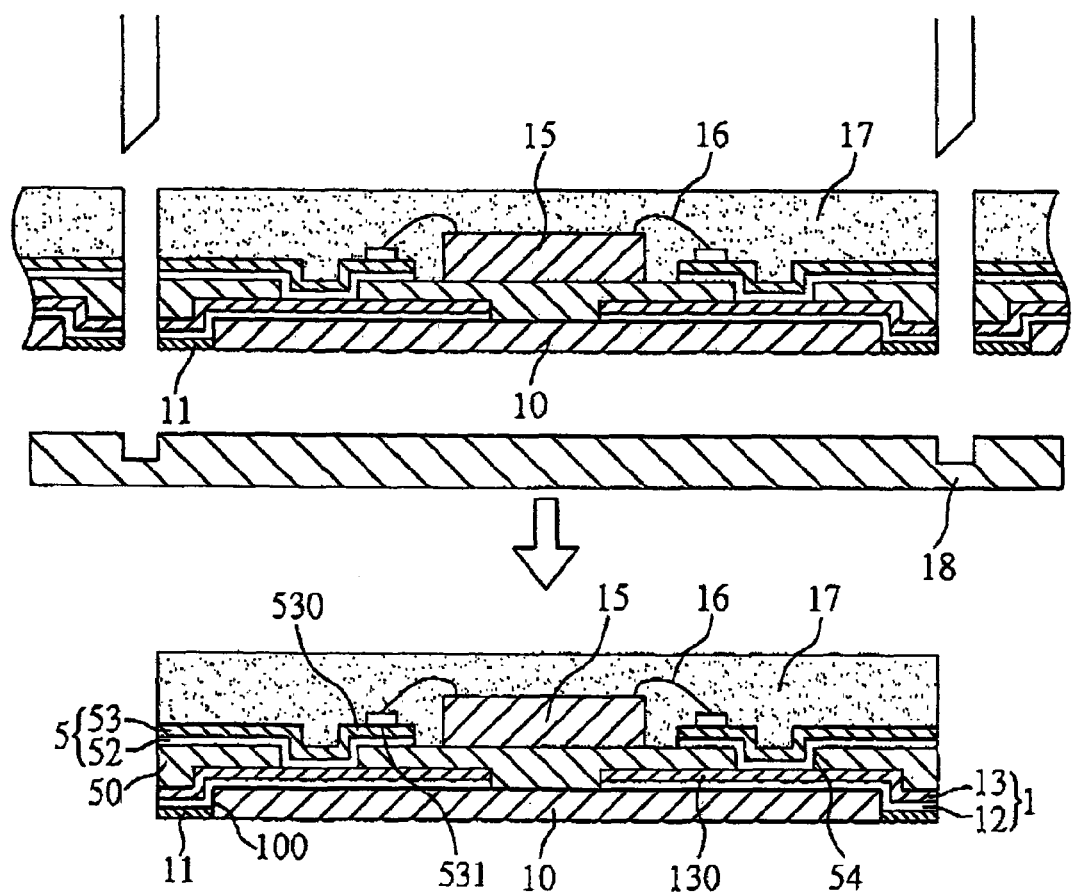

Finally, referring to FIG. 11F, a singulation process is performed to cut through the encapsulant 17, and the metal carrier 18 is removed from the first dielectric material layer 10 by for example an etching process, such that the first dielectric material layer 10 and the solder material 11 are partly exposed. The exposed part of the solder material 11 can serve as I/O connections of the semiconductor package to be electrically connected to an external device such as PCB (not shown). Alternatively, the exposed part of the solder material 11 can be implanted with a plurality of solder balls, similarly to the structure of the third embodiment shown in FIG. 5 such that the solder balls serve as I/O connections for providing external electrical connection for the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should accord with the broadest interpretation so as to encompass all such modifications and similar arrangements.

What is claimed is:

1. A semiconductor package, comprising:
   a first dielectric material layer formed with a plurality of openings penetrating the same;
   a conductive material applied in the openings of the first dielectric material layer;
   a first conductive layer formed on the first dielectric material layer and the conductive material, wherein the first conductive layer comprises a plurality of conductive traces;
   a second dielectric material layer applied over the first conductive layer, wherein a plurality of conductive vias are formed through the second dielectric material layer;
   a second conductive layer formed on the second dielectric material layer, and comprising a plurality of conductive traces, wherein each of the conductive traces of the second conductive layer has a terminal, and the conductive traces of the second conductive layer are electrically connected to the conductive traces of the first conductive layer by the conductive vias;
   at least one chip mounted on the second dielectric material layer and electrically connected to the terminals of the conductive traces of the second conductive layer; and
   an encapsulant for encapsulating the chip and the second conductive layer, with the first dielectric material layer and the conductive material being partly exposed from the encapsulant.

2. The semiconductor package of claim 1, further comprising a metal layer applied on the terminals of the conductive traces.

3. The semiconductor package of claim 2, wherein the metal layer is made of silver or a nickel/gold alloy.

4. The semiconductor package of claim 1, further comprising an insulating layer applied on the conductive traces of the second conductive layer, with the terminals of the conductive traces being exposed from the insulating layer.

5. The semiconductor package of claim 4, wherein the insulating layer is made of solder mask or polyimide.

6. The semiconductor package of claim 1, wherein the conductive material comprises a solder material.

7. The semiconductor package of claim 6, wherein the solder material comprises a tin/lead alloy.

8. The semiconductor package of claim 1, wherein the first conductive layer comprises a first copper layer formed on the first dielectric material layer and the conductive material, and a second copper layer formed on the first copper layer and comprising the plurality of conductive traces.

9. The semiconductor package of claim 8, wherein the first copper layer of the first conductive layer is smaller in thickness than the second copper layer thereof.

10. The semiconductor package of claim 1, wherein the second conductive layer comprises a first copper layer formed on the second dielectric material layer, and a second copper layer formed on the first copper layer and comprising the plurality of conductive traces.

11. The semiconductor package of claim 10, wherein the first copper layer of the second conductive layer is smaller in thickness than the second copper layer thereof.

12. The semiconductor package of claim 1, wherein the first and second dielectric material layers are respectively made of a material selected from the group consisting of epoxy resin, polyimide and polytetrafluoroethylene (PTFE).

13. The semiconductor package of claim 1, wherein the chip is electrically connected to the terminals by a plurality of bonding wires or solder bumps.

14. The semiconductor package of claim 1, further comprising a plurality of solder balls implanted on the exposed part of the conductive material.

* * * * *